United States Patent [19]

Bassin

[11] Patent Number: 5,249,097
[45] Date of Patent: Sep. 28, 1993

[54] HOUSING FOR CONTROL APPARATUS

[76] Inventor: Gilbert Bassin, c/o Pres Air:Trol Corp. 1009 W. Boston Post Rd., Mamaroneck, N.Y. 10543

[21] Appl. No.: 792,305
[22] Filed: Nov. 14, 1991
[51] Int. Cl.⁵ .............................................. H01G 4/38
[52] U.S. Cl. ..................................... 361/600; 174/50; 361/679
[58] Field of Search ....................... 174/50, 52.1, 52.5; 116/202; 362/96, 240; 361/331, 380, 42-46; 337/265, 266

[56] References Cited

U.S. PATENT DOCUMENTS 2,702,329  2/1955  Dietz, Jr. et al. .................... 337/265
4,443,780  4/1984  Huai-Chieh .......................... 337/266

*Primary Examiner*—Harold Broome
*Attorney, Agent, or Firm*—William E. Pelton

[57] ABSTRACT

Apparatus is provided for housing the controls for an electric circuit and a light indicator which is driven by the electric circuit. The electric circuit and light indicator are employed in proximity to a spa, whirlpool bathtub, hot tub or the like, and the apparatus is intended for operation by a human operator in contact with water. A front plate or display plate which is at least partially transparent or translucent is mounted on the tub in proximity to the water and helps to separate the electric circuit and light indicator from the water. The housing is mounted on a side of the plate away from the water and has a front portion which is at least partially transparent or translucent and in opposed relation to the plate, a rear edge portion spaced away from the plate, and an intermediate skirt portion connecting the front and rear portions. The housing is formed in one piece and has an opening defined by the rear edge portion to facilitate insertion of the light indicator into the housing. The electric circuit and light indicator are thus reliably protected against moisture, and the light indicator is visible to the operator through the plate and front portion.

3 Claims, 4 Drawing Sheets

HOUSING FOR CONTROL APPARATUS

BACKGROUND OF THE INVENTION

1. Field of the Invention

This invention relates to apparatus for housing the controls for an electric circuit and a light indicator which is driven by the electric circuit and, more particularly, to an improvement in such apparatus which has special utility where the apparatus is intended to house controls to be operated by a human operator in contact with water. The improvement enhances the safety of the operator and provides other benefits which will become apparent in the following description.

2. Description of the Prior Art

Many different forms of apparatus for housing the controls for an electric circuit and a light indicator which is driven by the electric circuit, the electric circuit and light indicator being employed in proximity to a spa, whirlpool bathtub, hot tub or the like, are known. Such apparatus is intended to house controls for operation by a human operator in contact with water. A display plate or panel is normally provided which is at least partially transparent or translucent. This plate is mounted in proximity to the water and helps to separate the electric circuit and light indicator from the water. However, indicator lights and the circuits therefor are sometimes mounted directly behind the plate thus giving rise to the potential for electric shock should the seal between the plate and the tub deteriorate with age. In other prior arrangements, the lights may be spaced from the plate by a number of clear plastic prisms, one for each light, which act as light tubes to carry light to the plate. The prisms, however, are sealed to corresponding openings in the plate at one end and to openings in the light housing at the other end by rubber cement, gaskets or clamps. These seals also deteriorate with time permitting leakage and eventual short circuits to occur. Such techniques moreover, were subject to human error in manufacture. Thus reliable waterproofing was difficult to achieve and could not be maintained over time.

An operator of the control apparatus may adjust a thermostat control and a plurality of air transmitters by means of push buttons or other types of actuators or sealed switches or thermometers mounted in the plate. The result of the operation may be independent switching of jet pumps, air blowers and lights. Typically, these units are employed in spas or whirlpool bathtubs but may also be specified for saunas, steam baths and the like.

It is clearly of the utmost importance to protect the operator against shock hazard. The plate mentioned above for helping to separate the electric circuit and the light indicator from the water may be attached to the side of the spa, whirlpool bathtubs, hot tub, etc., by a suitable sealant. The joint between the plate and the structure in which it is mounted and the joints between the push buttons, etc., and the plate may deteriorate over time, enabling water to leak into the area of the electric circuit and light indicator. Another hazard known heretofore is cracking of the front plate over time. This too allows moisture or water to seep into the electric circuitry behind the front panel. This presents a dangerous shock hazard to the operator or adversely affects the operation of the lamps.

Even in the absence of such leakage, condensation may form on the side of the plate away from the water, and this moisture may affect the operation of the electric circuit.

OBJECTS AND SUMMARY OF THE INVENTION

An object of the invention is to remedy the problems of the prior art noted above and in particular to provide apparatus for housing the controls for an electric circuit and a light indicator, where such controls are intended for operation by a human operator in contact with water, which is significantly safer in operation than conventional apparatus.

In accordance with the invention, there is provided, apparatus for housing controls for an electric circuit and a light indicator which is driven by said electric circuit, said electric circuit and light indicator being employed in proximity to a spa, whirlpool bathtub, hot tub or the like and being intended for operation by a human operator in contact with water, and wherein plate means which is at least partially transparent or translucent is mounted in proximity to the water and helps to separate said electric circuit and light indicator from the water, the improvement comprising a housing for mounting on a side of said plate means away from the water, said housing having a front portion which is at least partially transparent or translucent and in opposed relation to said plate means, a rear edge portion spaced away from said plate means, and an intermediate skirt portion connecting said front and rear portions, said housing being formed in one piece and having an opening defined by said rear edge portion to facilitate insertion of said light indicator into said housing, whereby said electric circuit and said light indicator and circuits therefor are reliably protected against moisture and said light indicator is visible to said operator through said plate means and front portion.

BRIEF DESCRIPTION OF THE DRAWINGS

A better understanding of the objects, features and advantages of the invention may be gained from a consideration of the following detailed description of the preferred embodiment thereof, wherein corresponding reference characters in the several figures refer to corresponding parts, and wherein.

DESCRIPTION OF THE PREFERRED EMBODIMENTS

Figure 2:
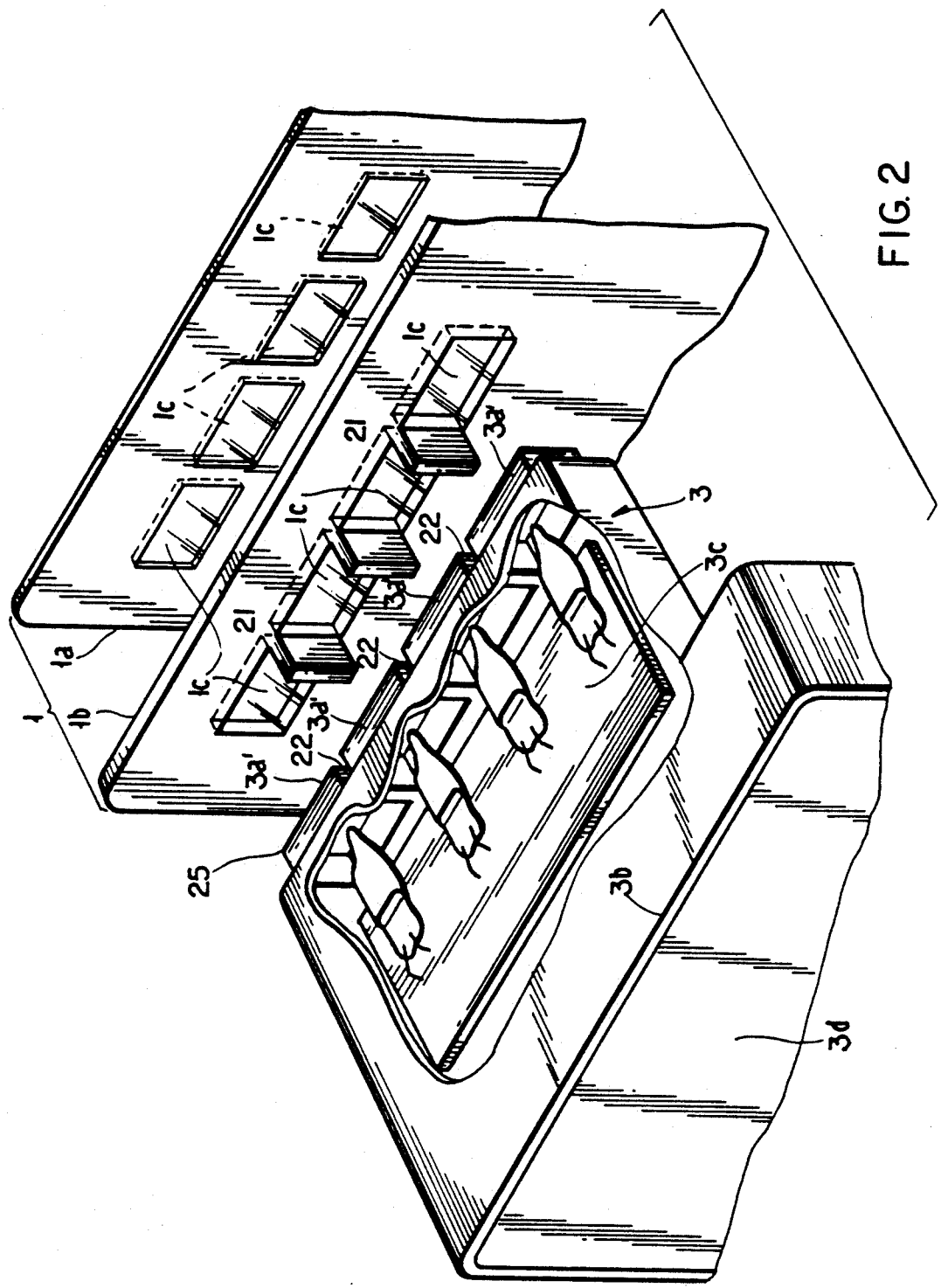
FIG. 2 is an exploded perspective view from the rear of the apparatus of FIG. 1.
Figure 4:
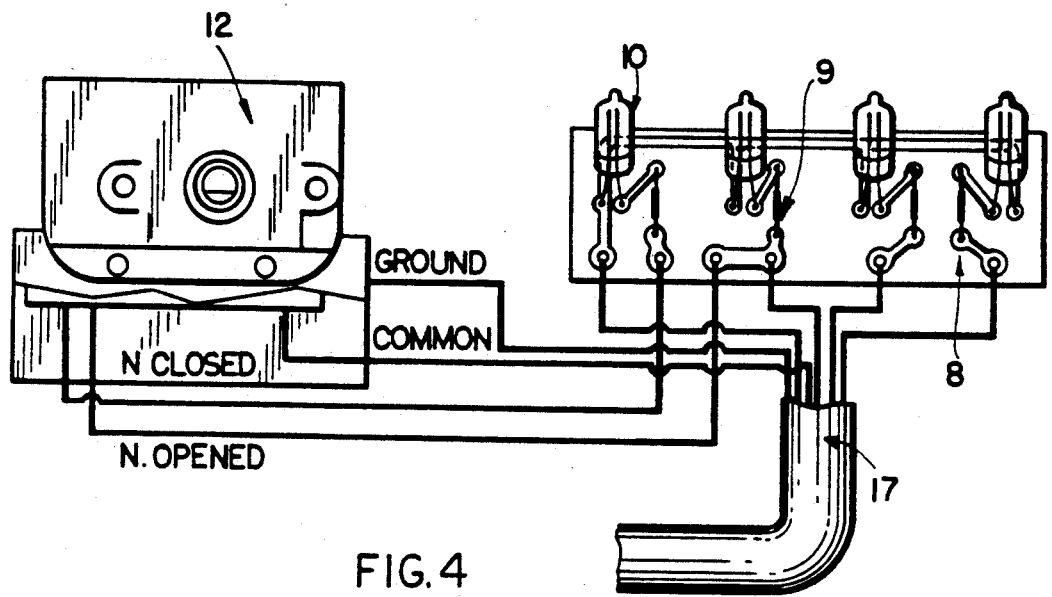
FIGS. 4, 5 and 6 are views showing a wiring schematic of the apparatus.

The figures show a top plate or plate means 1, housing 3, actuator cover 4, thermostat knob 5, push buttons 6, printed circuit board 8, resistor 9, neon bulbs or light indicator 10, actuator 11, thermostat 12, line cord 17, compression nut 19 and rubber bushing 20. The plate 1 includes portions 1a and 1b as indicated in FIG. 2. The two together form plate means which is at least partially transparent or translucent in areas 1c. The plate 1 is mounted in proximity to the water and helps to separate the electric circuit 8-10 and 17 including a light indicator such as neon bulbs or lamps 10 from the water.

The housing 3 has a front portion 25 which is at least partially transparent or translucent in areas 3a' and in opposed relation to the front cover or plate 1. The housing also has a rear edge portion 3b spaced apart from the plate and an intermediate skirt portion 3c connecting the front and rear portions 25, 3b. The first portion 25 is preferably formed with a plurality of protruding sections 3a, separated by channels or grooves 22, one such section 3a being provided for each of a plurality of lamps 10. In one embodiment, the transparent or translucent areas 3a' are formed as the outer surface of each of the sections 3a.

The housing 3 is formed in one piece and has an opening 3d defined by the rear portion 3b to facilitate insertion of the lamps 10 and their electric drive circuit into the housing 3, whereby the electric circuits 8-10, 17 and the light indicators or lamps 10 are reliably protected against moisture. The lamps 10 are visible to the operator through the front plate 1 and front portion 3a'.

Preferably, the housing 3 is formed separately from the plate 1 and can be mounted at a variable distance therefrom to adjust the brightness of the light indicator 10 as perceived by the operator.

The plate 1 is formed with positioning guides 21 and the housing 3 is formed with means such as grooves 22 cooperating with the guides 21 for guiding the housing 3 into proper alignment with the plate 1.

Figure 1:
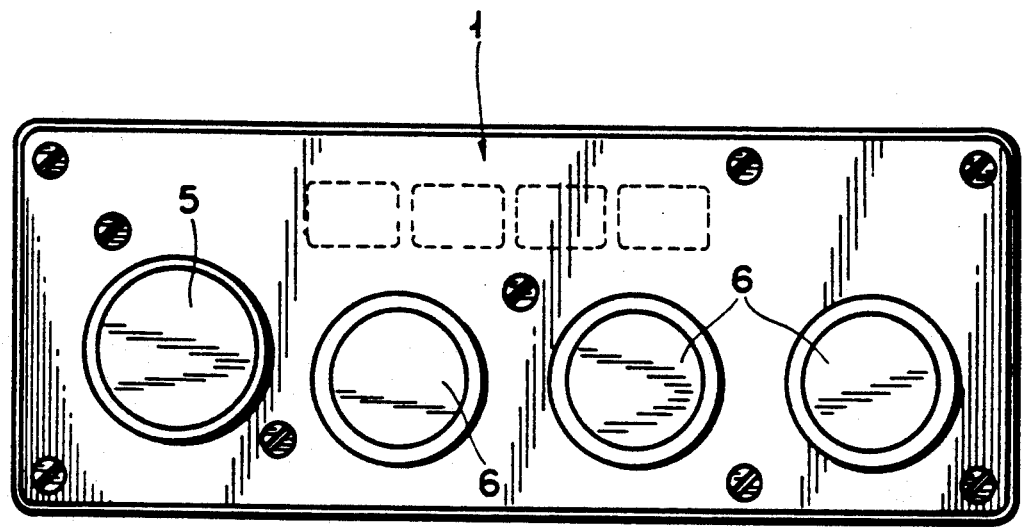
FIG. 1 is a view in front elevation of apparatus constructed in accordance with the invention.
Figure 3:
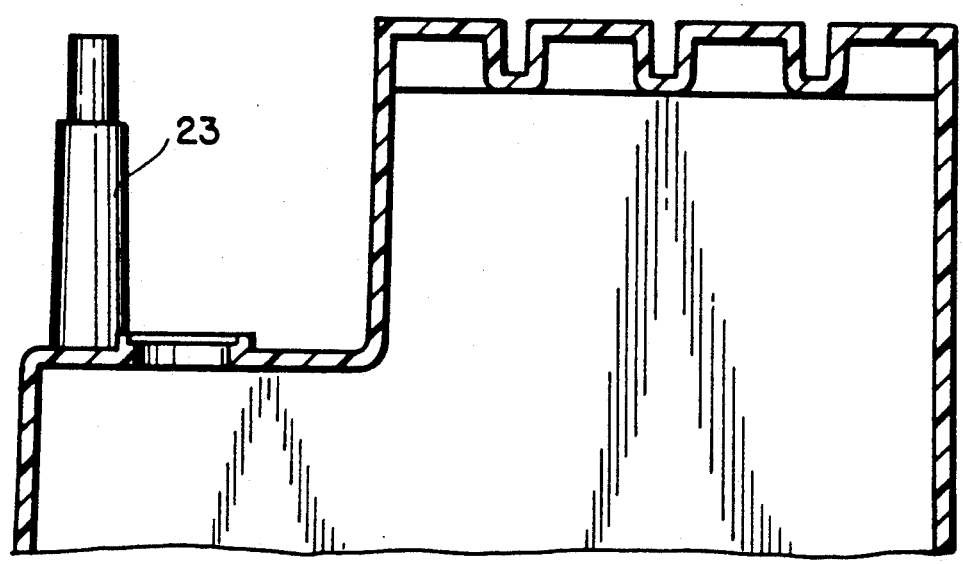
FIG. 3 is a bottom plan view of a portion of the apparatus of FIG. 2.
Figure 5:
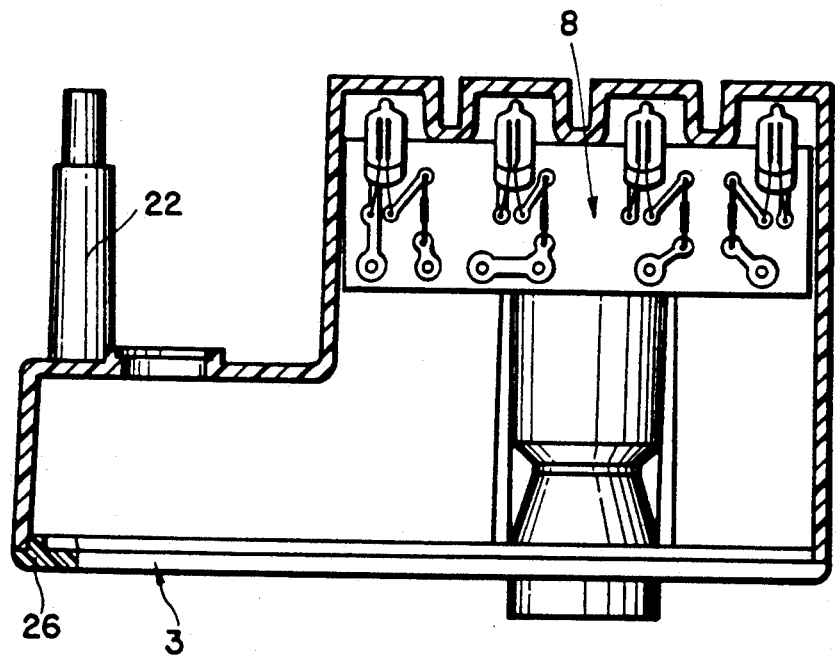
Figure 6:
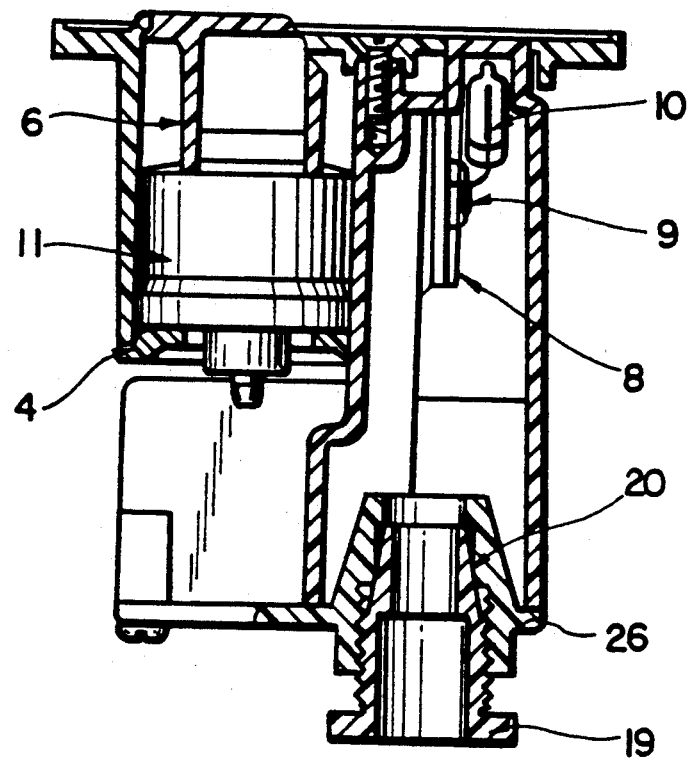

When installed, the opening 3d at the rear of the housing is closed by preferably sealing the rear edge portion 3b to a back plate 2b (FIG. 6) by means of a suitable gasket or the like. The rod 23 (FIGS. 3 and 5) constitutes a stand-off which abuts against the back side of the top plate and may be affixed thereto with screws or the like, as desired.

Thus there is provided in accordance with the invention a novel and highly effective apparatus for controlling an electric circuit and light indicator which is intended for operation by a human operator in contact with water. Even in case of condensation or leakage around the push buttons, or cracking of the top plate, etc., the electric components are protected against moisture.

Many modifications of the preferred embodiment of the invention disclosed above will readily occur to those skilled in the art. In particular, the number of push buttons 6 or the number of lamps 10 provided in accordance with the invention may be varied depending on the number of functions to be performed. Other components such as thermometers or electric buttons may also be mounted to the top plate without departing from the scope of the invention. Accordingly the invention is not limited except by the appended claims.

I claim:

1. Control apparatus comprising:
   an actuator;
   an electric circuit;
   a light indicator which is connected to and driven by said electric circuit, said actuator, electric circuit and light indicator being employed in proximity to a spa, whirlpool bathtub, hot tub, steam bath or the like, said actuator being intended for actuation by a human operator in contact with water or steam to control an operation of said spa, whirlpool bathtub, hot tub, steam bath or the like and said light indicator being responsive to said operation;
   plate means which is at least partially transparent or translucent mounted in proximity to the water or steam and helping to separate said electric circuit and light indicator from the water or steam; and
   a housing for mounting on a side of said plate means away from the water or steam, said housing having a front portion which is at least partially transparent or translucent and in opposed relation to said plate means, a rear edge portion spaced away from said plate means, and an intermediate skirt portion connecting said front and rear edge portions;
   said housing being formed in one piece and having a sealable opening defined by said rear edge portion to facilitate insertion of at least said light indicator into said housing;
   whereby said electric circuit and said light indicator are reliably protected against moisture and said light indicator is visible to said operator through said plate means and front portion while said operator is in contact with the water or steam.

2. Control apparatus according to claim 1 wherein said housing is formed separately from said plate means and can be mounted at a variable distance therefrom to adjust the brightness of said light indicator as perceived by said operator.

3. Control apparatus according to claim 2 wherein said plate means is formed with positioning guides and said housing is formed with means cooperating with said guides for guiding said housing into proper alignment with said plate means.

* * * * *